(12) United States Patent
Tanase

(10) Patent No.: US 8,446,264 B2
(45) Date of Patent: May 21, 2013

(54) PORTABLE ELECTRONIC DEVICE HAVING A WATERPROOF KEYPAD

(75) Inventor: Silviu Tanase, Kitchener (CA)

(73) Assignee: Research In Motion Limited, Waterloo (CA)

( * ) Notice: Subject to any disclaimer, the term of this patent is extended or adjusted under 35 U.S.C. 154(b) by 324 days.

(21) Appl. No.: 12/840,325

(22) Filed: Jul. 21, 2010

(65) Prior Publication Data

US 2012/0020045 A1    Jan. 26, 2012

(51) Int. Cl.
*G08B 6/00*    (2006.01)
(52) U.S. Cl.
USPC ........................................................ 340/407.2
(58) Field of Classification Search
None
See application file for complete search history.

(56) References Cited

U.S. PATENT DOCUMENTS

| | | | |
|---|---|---|---|
| 6,710,518 B2 * | 3/2004 | Morton et al. | 310/328 |
| 7,056,042 B2 | 6/2006 | Pihlaja | |
| 7,312,984 B2 | 12/2007 | Richardson et al. | |
| 7,468,573 B2 | 12/2008 | Dai et al. | |
| 2002/0084721 A1 * | 7/2002 | Walczak | 310/339 |
| 2005/0030048 A1 * | 2/2005 | Bolender et al. | 324/661 |
| 2005/0054390 A1 | 3/2005 | Tuovinen | |
| 2006/0052143 A9 | 3/2006 | Tuovinen | |
| 2007/0036349 A1 * | 2/2007 | Yang et al. | 379/433.13 |
| 2008/0100568 A1 * | 5/2008 | Koch et al. | 345/156 |
| 2008/0132289 A1 | 6/2008 | Wood et al. | |
| 2008/0150912 A1 * | 6/2008 | Keski-Jaskari | 345/174 |
| 2008/0291169 A1 * | 11/2008 | Brenner et al. | 345/168 |
| 2008/0309589 A1 * | 12/2008 | Morales | 345/36 |
| 2008/0309638 A1 * | 12/2008 | Tatehata | 345/173 |
| 2009/0091479 A1 | 4/2009 | Sinha | |
| 2009/0160682 A1 | 6/2009 | Bolender et al. | |
| 2010/0282581 A1 * | 11/2010 | Lin | 200/314 |
| 2011/0080347 A1 * | 4/2011 | Steeves et al. | 345/173 |

FOREIGN PATENT DOCUMENTS

| | | |
|---|---|---|
| EP | 1703764 | 9/2006 |
| JP | 2008139961 | 6/2008 |
| WO | WO 03/047007 | 6/2003 |

OTHER PUBLICATIONS

Extended European Search Report Relating to Application No. 10170306.4; Dec. 20, 2010; 8 Pages.

* cited by examiner

*Primary Examiner* — Lisa Lea Edmonds
*Assistant Examiner* — Xanthia C Cunningham
(74) *Attorney, Agent, or Firm* — Ridout and Maybee LLP

(57) ABSTRACT

A portable electronic device having a waterproof keypad and a keypad assembly for the waterproof keypad are described. In one embodiment, the keypad assembly comprises: an embossed keypad having a top and bottom surface, the embossed keypad having a plurality of embossed keys on the top surface; a capacitive sensor layer located below the bottom surface of the embossed keypad; and an actuator located below the capacitive sensor layer moveable between a first position in an unactuated state to a second position in an actuated state.

17 Claims, 12 Drawing Sheets

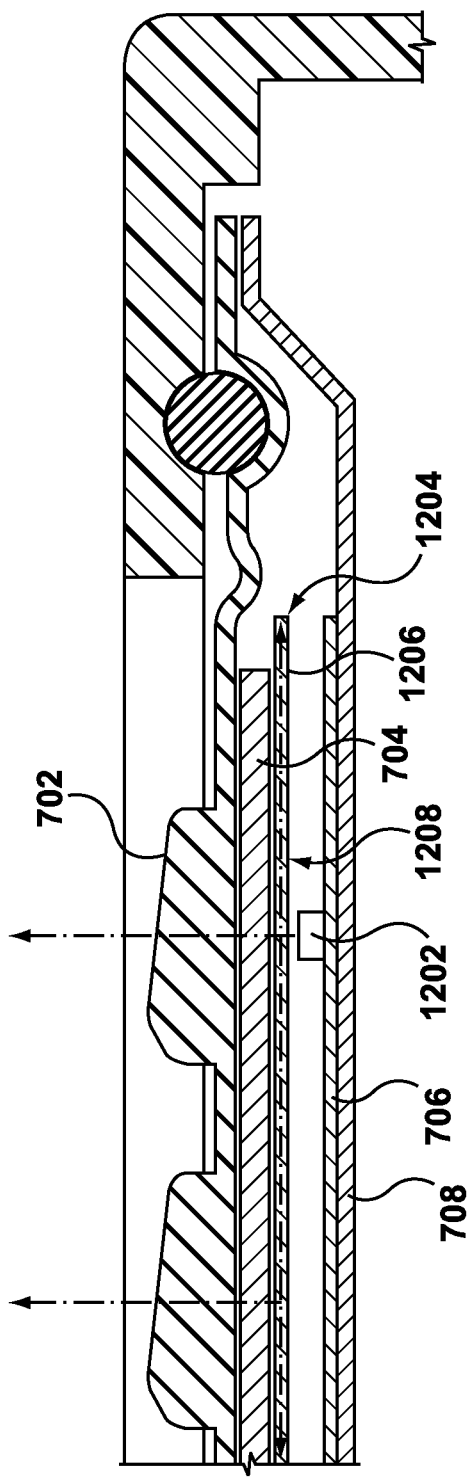

PORTABLE ELECTRONIC DEVICE HAVING A WATERPROOF KEYPAD

TECHNICAL FIELD

The present disclosure relates to portable electronic devices, including but not limited to portable electronic devices having a portable electronic device having a waterproof keypad.

BACKGROUND

Electronic devices, including portable electronic devices, have gained widespread use and may provide a variety of functions including, for example, telephonic, electronic messaging and other personal information manager (PIM) application functions. Portable electronic devices include, for example, several types of mobile stations such as simple cellular telephones, smart telephones, wireless personal digital assistants (PDAs), and laptop computers with wireless 802.11 or Bluetooth™ capabilities.

Portable electronic devices such as PDAs or smart telephones are generally intended for handheld use and ease of portability. Smaller devices are generally desirable for portability. Portable electronic devices frequently encounter water hazards as a result of the portability of such devices and the tendency of device users to carry their portable electronic devices with them most anywhere they travel. The waterproofing of portable electronic devices tends to hinder the performance of the devices, particularly the performance of device components with which the user physically interacts such as the keyboard or keypad.

BRIEF DESCRIPTION OF THE DRAWINGS

FIG. 12 is a sectional side view of showing an example embodiment of a light guide assembly for backlighting the embossed keypad 702.

DETAILED DESCRIPTION OF EXAMPLE EMBODIMENTS

Figure 1:
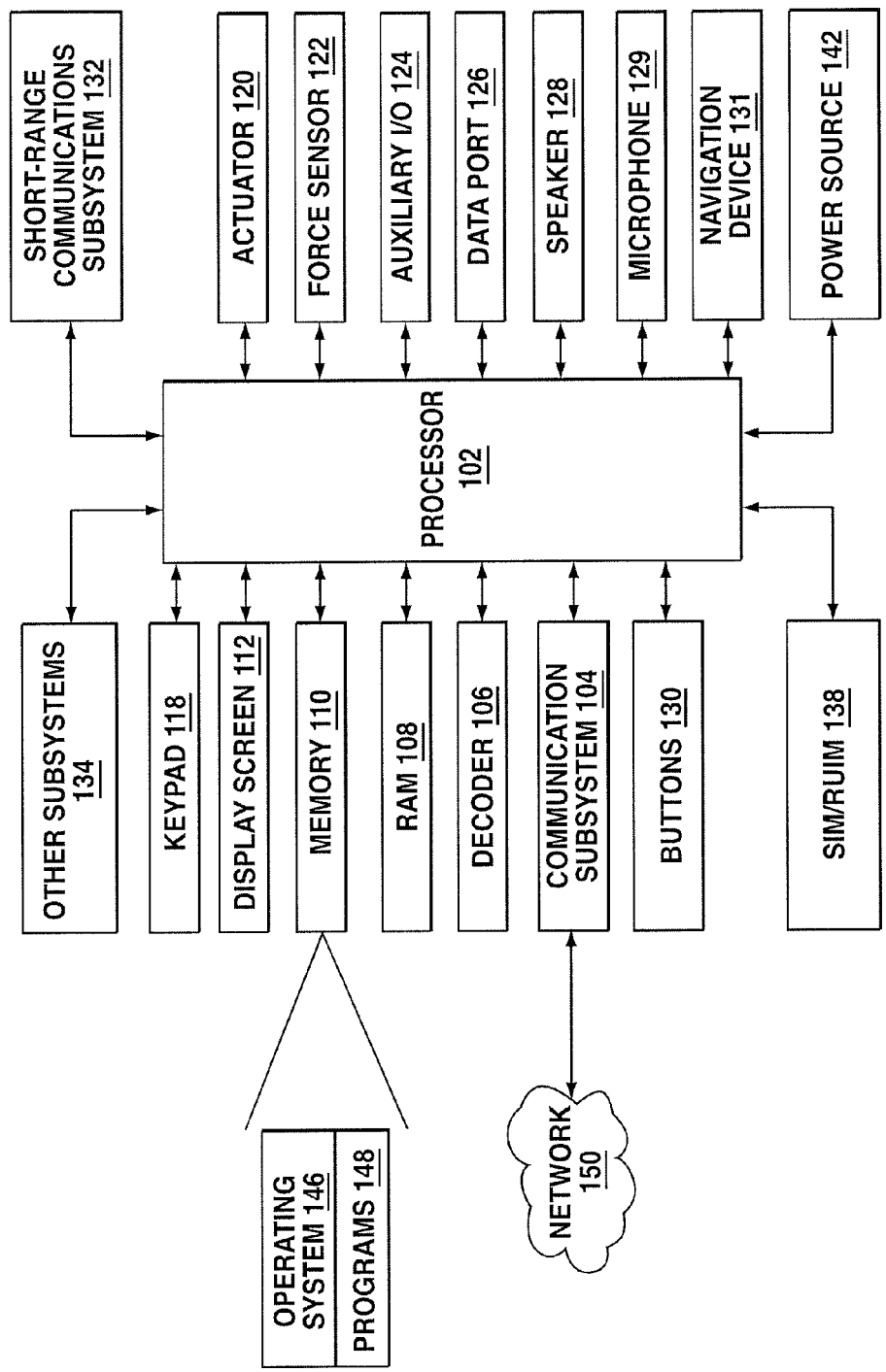
FIG. 1 is a simplified block diagram of components including internal components of a portable electronic device in accordance with one example embodiment of the present disclosure.

The present disclosure describes a portable electronic device having a waterproof keypad and a keypad assembly for the waterproof keypad. In accordance with one embodiment, there is provided a keypad assembly comprising: an embossed keypad having a top and bottom surface, the embossed keypad having a plurality of embossed keys on the top surface; and a capacitive sensor layer located below the bottom surface of the embossed keypad.

In accordance with another embodiment, there is provided a keypad assembly comprising: an embossed keypad having a top and bottom surface, the embossed keypad having a plurality of embossed keys on the top surface; a capacitive sensor layer located below the bottom surface of the embossed keypad; and an actuator located below the capacitive sensor layer moveable between a first position in an unactuated state to a second position in an actuated state.

In accordance with a further embodiment, there is provided a portable electronic device comprising: a housing having a front face and defining an aperture in the front face, the aperture in the front face opening into an internal cavity defined by the housing; a processor received within the housing; the keypad assembly as described above and herein, wherein the capacitive sensor layer of the keypad assembly is connected to the processor, the capacitive sensor layer transmitting input signals to the processor when an object is detected near to or touching an embossed key in the embossed keypad; and a gasket located around a perimeter of a keypad area of the embossed keypad and between the embossed keypad and an inner surface of the internal cavity of the housing, the gasket sealing the key assembly to the front face of the housing.

In accordance with yet a further embodiment, there is provided a method of generating output using a keypad assembly, the keypad assembly comprising an embossed keypad having a top and a bottom surface, the embossed keypad having a plurality of embossed keys on the top surface, a capacitive sensor layer located below the bottom surface of the embossed keypad, wherein the capacitive sensor layer comprises a capacitive sheet including a number of capacitive plate electrodes configured to detect the presence of an object near to or touching an embossed key in the embossed keypad, the method comprising: determining a location of a capacitive plate pair which experiences a change in capacitance exceeding a threshold capacitance change caused by the presence of an object near to or touching the embossed keypad; determining a particular key in the embossed keys of the embossed keypad in accordance with the determined location; and generating an output in accordance with the determined key.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

The disclosure generally relates to an electronic device, which is a portable electronic device in the embodiments described herein. Examples of portable electronic devices include mobile, or handheld, wireless communication devices such as pagers, cellular phones, cellular smartphones, wireless organizers, personal digital assistants, wirelessly enabled notebook computers, and so forth. The portable electronic device may also be a portable electronic device without wireless communication capabilities, such as a handheld electronic game device, digital photograph album, digital camera, or other device.

A block diagram of an example of a portable electronic device 100 is shown in FIG. 1. The portable electronic device 100 includes multiple components, such as a processor 102 that controls the overall operation of the portable electronic device 100. Communication functions, including data and voice communications, are performed through a communication subsystem 104. Data received by the portable electronic device 100 is decompressed and decrypted by a decoder 106. The communication subsystem 104 receives messages from and sends messages to a wireless network 150. The wireless network 150 may be any type of wireless network, including, but not limited to, data wireless networks, voice wireless networks, and networks that support both voice and data communications. A power source 142, such as one or more rechargeable batteries or a port to an external power supply, powers the portable electronic device 100.

The processor 102 interacts with other components, such as Random Access Memory (RAM) 108, memory 110, a display screen 112 (such as a liquid crystal display (LCD)), a keypad 118, one or more actuators 120, one or more force sensors 122, one or more auxiliary input/output (I/O) subsystems 124, a data port 126, a speaker 128, a microphone 129, one or more keys or buttons 130, a navigation device 131, short-range communications subsystem 132, and other device subsystems 134. Information, such as text, characters, symbols, images, icons, and other items that may be displayed or rendered on a portable electronic device, is displayed on the display screen 112 via the processor 102. In some embodiments, the display screen 112 may be provided with a touch-sensitive overlay (not shown) operably connected to an electronic controller (not shown) to form a touch-sensitive display.

Figure 2A:
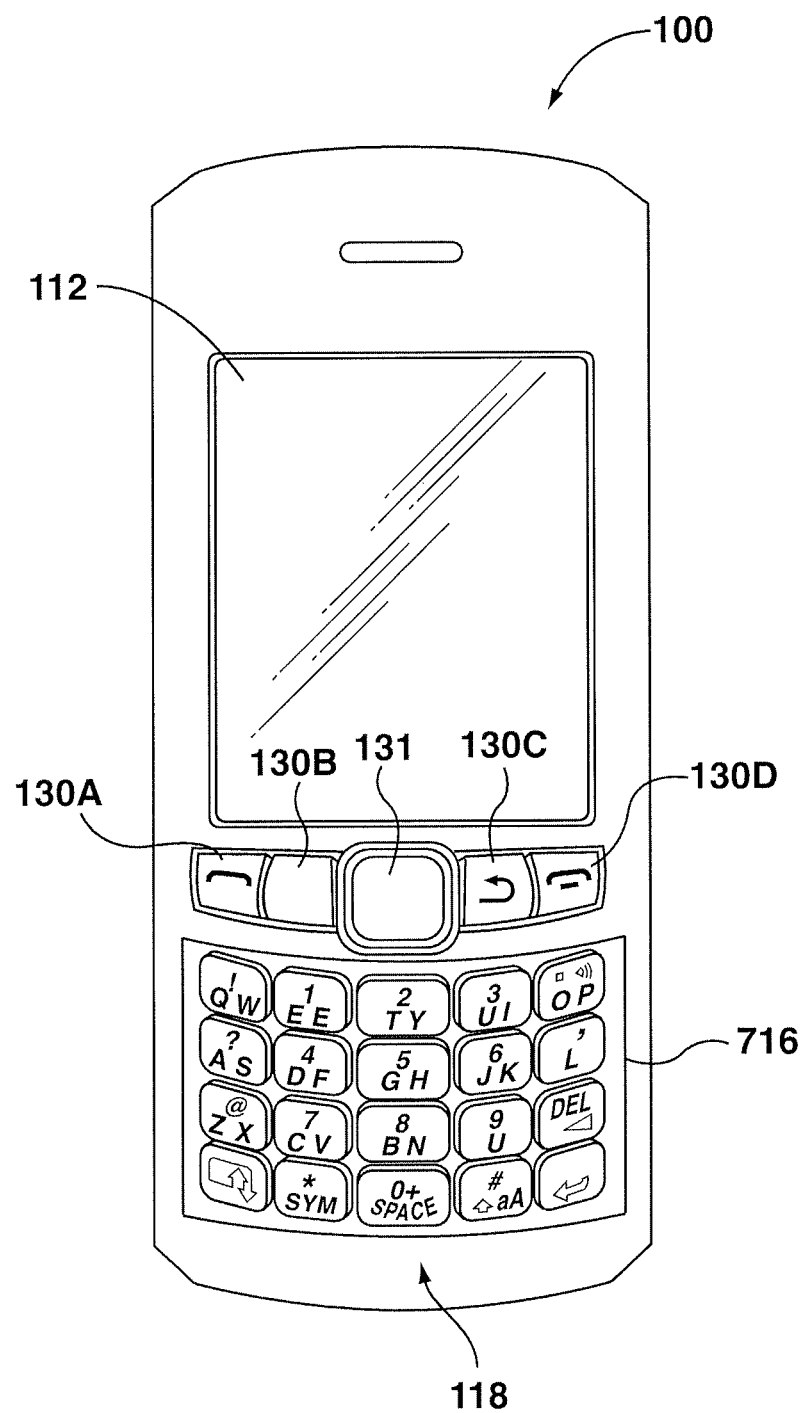
FIG. 2A is a front view of a portable electronic device having a reduced QWERTY keypad in accordance with an example embodiment of the present disclosure.
Figure 2B:
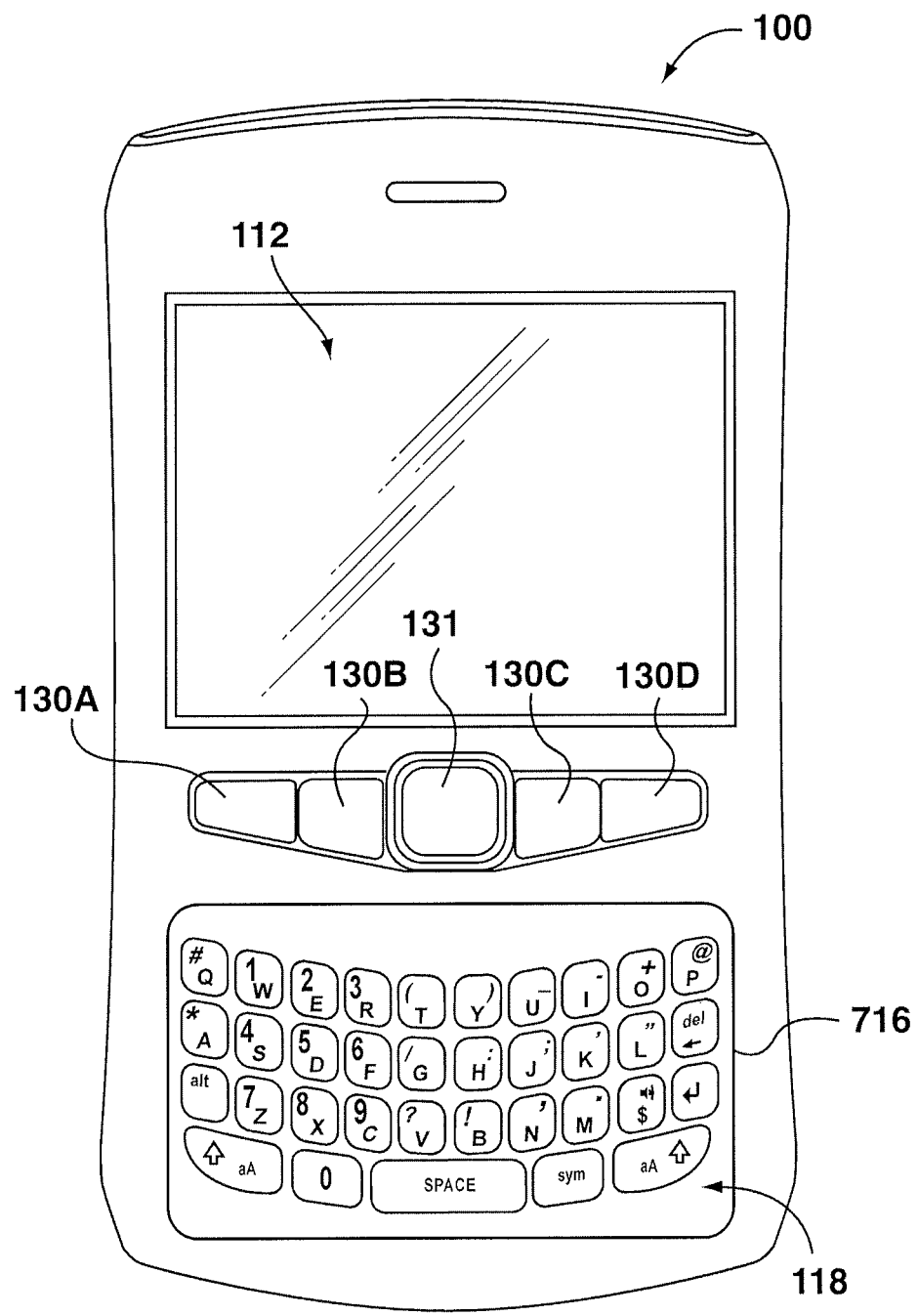
FIG. 2B is a front view of a portable electronic device having a full QWERTY keypad in accordance with an example embodiment of the present disclosure.

Referring now to FIGS. 1-2B, the buttons 130, represented individually by references 130A, 130B, 130C and 130D, are located below the display screen 112 and above the keypad 118 on a front face of the portable electronic device 100. The buttons 130 generate corresponding input signals when activated. The buttons 130 may be constructed using any suitable button (or key) construction such as, for example, a dome-switch construction. The actions performed by the device 100 in response to activation of respective buttons 130 are context-sensitive. The action performed depends on a context that the button was activated. The context may be, but is not limited to, a device state, application, screen context, selected item or function, or any combination thereof.

The buttons 130, in the shown embodiment, are an answer (or send) button 130A, menu button 130B, escape (or back) button 130C, and a hang up (or end) button 130D. The send/answer button 130A may be used for answering an incoming voice call, invoking a menu for a phone application when there is no voice call in progress, or initiating an outbound voice phone call from the phone application when a phone number is selected in the phone application. The menu button 130B may be used to invoke a context-sensitive menu comprising context-sensitive menu options. The escape/back button 130C may be used to cancel a current action, reverse (e.g., "back up" or "go back") through previous user interface screens or menus displayed on the display screen 112, or exit the current application 148. The end/hang up button 130D may be used to end a voice call in progress or hide the current application 148.

The navigation device 131 may be a depressible (or clickable) joystick such as a depressible optical joystick, a depressible trackball, a depressible scroll wheel, or a depressible touch-sensitive trackpad or touchpad. FIGS. 2A and 2B show the navigation device 131 in the form of a depressible optical joystick or trackpad having an optical lens which detects the presence of an object in front of the lens, such as a user's finger, and detects directional inputs caused by movements of objects in front of the lens, such as movements of the user's finger.

When the navigation device 131 is a depressible optical joystick, movements of the user's finger, such as vertical and horizontal movements, are detected by an optical sensor of the optical joystick. Up, down, left or right movements detected by the optical joystick are interpreted as corresponding up, down, left or right navigation inputs/commands which are performed by the processor 102. The content displayed on the display screen 112 and/or an onscreen position indicator (commonly referred to as a caret, cursor or focus) is moved from an initial location focusing one onscreen item to a new location focusing a different onscreen item. Typically, navigation is performed using 1:1 movement so that each direction gesture or movement detected by the navigation device 131 causes a corresponding navigation movement.

When operating the keypad 118, the actuator(s) 120 may be depressed or activated by applying sufficient force to the keypad 118 to overcome the actuation force of the actuator 120. The actuator(s) 120 may be actuated by pressing anywhere on the keypad 118, and may provide input to the processor 102 when actuated. Actuation of the actuator(s) 120 may result in provision of tactile feedback for the keypad 118. When force is applied, the keypad 118 is depressible, pivotable, and/or movable. Such a force may actuate the actuator(s) 120.

Although not limited to those actuators 120 disclosed in the present application, a mechanical dome switch actuator (not shown) may be utilized. In this example, tactile feedback is provided when the dome collapses due to imparted force and when the dome returns to the rest position after release of the switch.

Alternatively, the actuator 120 may comprise one or more piezoelectric elements that provide tactile feedback for the keypad 118. Contraction of the piezoelectric actuators applies a spring-like force, for example, opposing a force externally applied to the keypad 118. Each piezoelectric actuator includes a piezoelectric device, such as a Lead Zirconate Titanate (PZT) ceramic disc adhered to a substrate that may comprise metal and/or another flexible or elastically deformable material. The substrate bends when the piezoelectric device contracts due to build-up of charge/voltage at the piezoelectric device or in response to a force, such as an external force applied to the keypad 118. The charge/voltage on the piezoelectric device may be removed by a controlled discharge current that causes the piezoelectric device to expand, releasing the force, thereby decreasing the force applied by the piezoelectric device. The charge/voltage may advantageously be removed over a relatively short period of time to provide tactile feedback. Absent an external force and absent a charge on the piezoelectric device, the piezoelectric device may be slightly bent due to a mechanical preload.

Optional force sensors 122 may be disposed in conjunction with the keypad 118 to determine or react to forces applied to the keypad 118. The force sensor 122 may be disposed in line with the piezoelectric device 120. The force sensors 122 may be force-sensitive resistors, strain gauges, piezoelectrib or piezoresistive devices, pressure sensors, quantum tunneling composites, force-sensitive switches, or other suitable devices. Force as utilized throughout the specification, including the claims, refers to force measurements, estimates, and/or calculations, such as pressure, deformation, stress, strain, force density, force-area relationships, thrust, torque, and other effects that include force or related quantities.

To identify a subscriber for network access, the portable electronic device 100 uses a Subscriber Identity Module or a Removable User Identity Module (SIM/RUIM) card 138 for communication with a network, such as the wireless network 150. Alternatively, user identification information may be programmed into memory 110.

The portable electronic device 100 includes an operating system 146 and software applications or programs 148 that are executed by the processor 102 and are typically stored in a persistent, updatable store such as the memory 110. Additional applications or programs 148 may be loaded onto the portable electronic device 100 through the wireless network 150, the auxiliary I/O subsystem 124, the data port 126, the short-range communications subsystem 132, or any other suitable subsystem 134.

A received signal such as a text message, an e-mail message, or web page download is processed by the communication subsystem 104 and input to the processor 102. The processor 102 processes the received signal for output to the display screen 112 and/or to the auxiliary I/O subsystem 124. A subscriber may generate data items, for example e-mail messages, which may be transmitted over the wireless network 150 through the communication subsystem 104. For voice communications, the overall operation of the portable electronic device 100 is similar. The speaker 128 outputs audible information converted from electrical signals, and the microphone 129 converts audible information into electrical signals for processing.

Referring to FIGS. 2A and 2B, front views of the portable electronic device 100 having a reduced QWERTY keypad and a full QWERTY keypad 118, respectively in accordance with example embodiments of the present disclosure are shown. Each key of the keypads 118 may be associated with one or more indicia representing an alphabetic character, a numeral or a command (such as a space command, return command, or the like). The plurality of the keys having alphabetic characters may be arranged in a standard keyboard layout such as a QWERTY layout (shown in FIGS. 2A and 2B), a QZERTY layout, a QWERTZ layout, an AZERTY layout, a Dvorak layout, a Russian keyboard layout, a Chinese keyboard layout, or other suitable layout. These standard layouts are provided by way of example and other similar standard layouts may be used. The keyboard layout may be based on the geographical region in which the portable electronic device 100 is intended for use.

Figure 3:
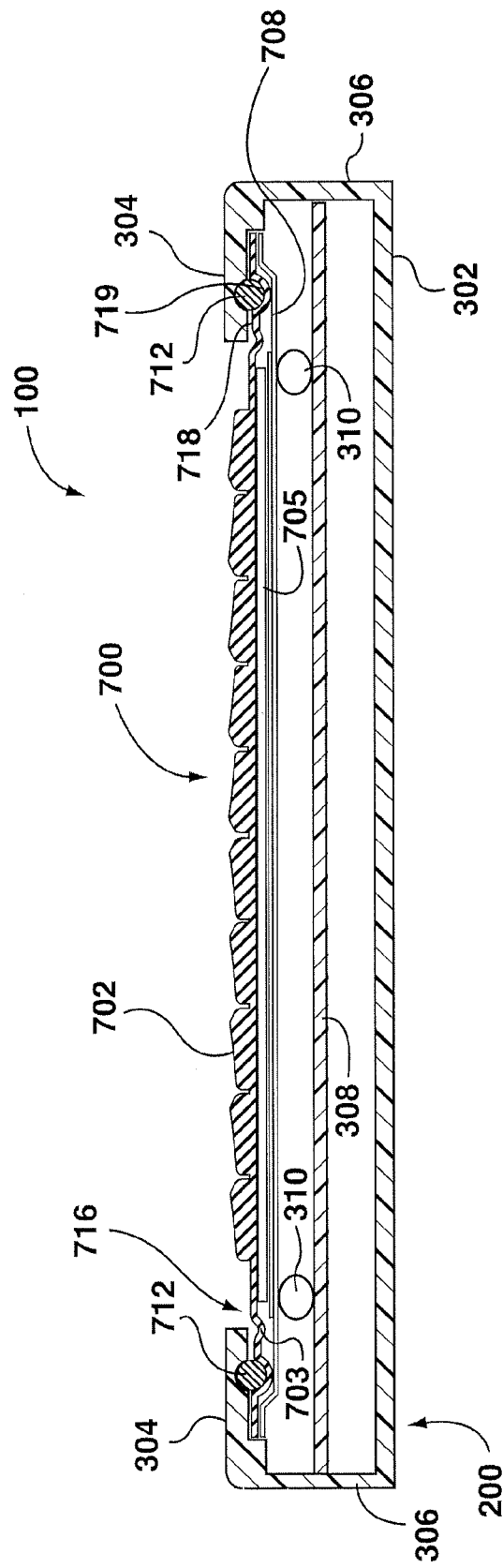
FIG. 3 is a sectional side view of portions of the portable electronic device of FIG. 2B.

FIG. 3 shows a sectional side view of portions of the portable electronic device 100. The housing 200 in the present example includes a back 302, a front face 304 which frames the display screen 112 and keypad 118, and sidewalls 306 that extend between and generally perpendicular to the back 302 and the front face 304. A base 308 is spaced from and is generally parallel to the back 302. The base 308 may be any suitable base and may comprise, for example, a rigid printed circuit board (PCB) or flexible PCB supported by a stiffener which forms the main PCB (not shown) of the portable electronic device 100 to which the processor 102 is connected. The back 302 may include a plate (not shown) that is releasably attached for insertion and removal of, for example, the power source 142 and the SIM/RUIM card 138 referred to above. The back 302, sidewalls 306 and front face 304 may be injection molded to form a unitary piece, for example.

Figure 4:
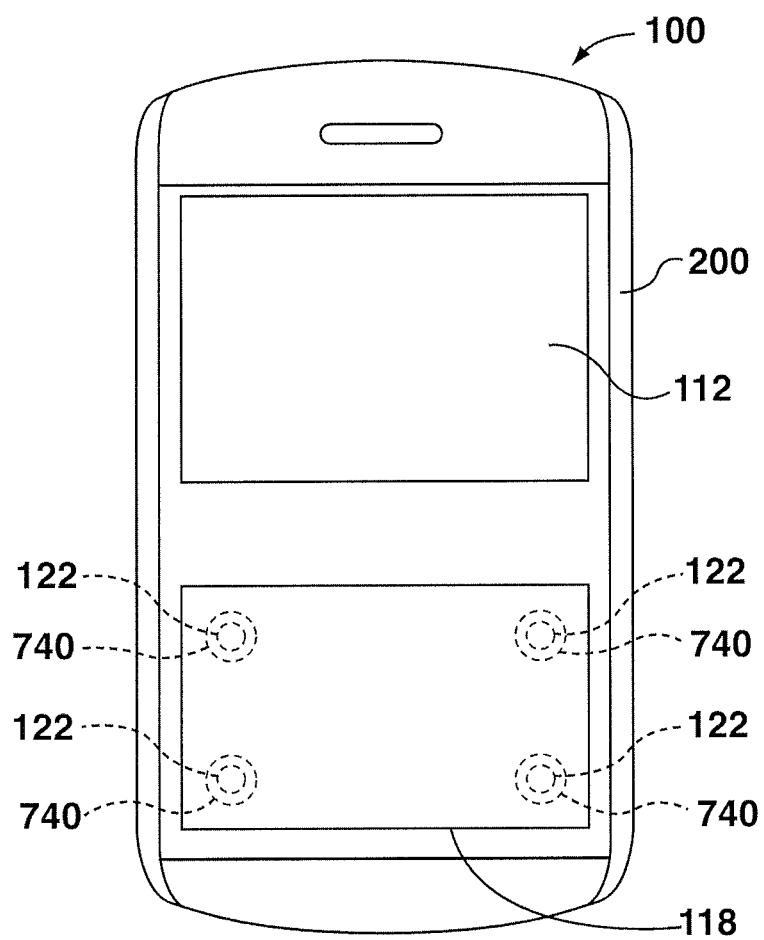
FIG. 4 is a front view of an example of the portable electronic device in FIG. 2B in a portrait orientation, showing hidden detail in stippled lines.

FIG. 4 shows a front view of an example of the portable electronic device 100 of FIG. 2B in portrait orientation with hidden details shown in stippled lines. The portable electronic device 100 includes a housing 200 that houses internal components including internal components shown in FIG. 1 and frames the display screen 112 as well as the keypad 118 so that the keypad 118 is exposed for interaction therewith. The housing 200 may be any suitable housing for the internal components shown in FIG. 1.

FIGS. 3 and 6 to 10 illustrate a keypad assembly 700 in accordance with an example embodiment of the present disclosure incorporated into the portable electronic device 100. The keypad assembly 700 comprises the keypad 118, an actuator 120 or a number of actuators 120 and optionally force sensor(s) 122. The keypad assembly 700 is received in an aperture 716 defined in the front face 304 of the housing 200 so as to expose the keypad 118 for interaction. The aperture 716, also referred to as a keypad window 716, provides an opening of an internal cavity of the housing 200 in which the internal components of the portable electronic device 100 are housed. As best shown in FIG. 3, the keypad assembly 700 may be biased away from the base 308, toward the housing 200 by resilient biasing elements 310 such as gel pads between the support tray 708 and the base 308. A space between the base 308 and the keypad assembly 700 may be used to accommodate internal components of the portable electronic device 100 mounted to the main PCB. A compliant gasket 712 is located between an upper portion of the support tray 708 and the housing 200. The keypad assembly 700 may be moveable within the housing 200 as the keypad assembly 700 can be moved toward the base 308, thereby compressing the biasing elements 310. Movement of the keypad assembly 700 is used to provide tactile feedback, as described more fully below.

The keypad 118 is a capacitive embossed keypad which comprises an embossed keypad 702 having a top and a bottom surface and a capacitive sensor layer 704 located below the bottom surface of the embossed keypad 702. The embossed keypad 702 includes a keypad area on its top surface which comprises a number of embossed indicia including embossed keys. The keypad area is bound by the outer periphery of the outermost keys of the embossed keypad 702. The relative position of the embossed keypad 702 and capacitive sensor layer 704 is fixed, for example, by adhering or bonding the embossed keypad 702 and capacitive sensor layer 704 together using a suitable adhesive such as a non-conductive adhesive. The keypad 118 provides an array of capacitive embossed keys which simulate the keys of a conventional keyboard or keypad.

The embossed keys simulate key tops or key caps. The height of the embossed keys, the material of construction, or both, are selected so as to allow the capacitive sensor layer 704 located below the embossed keypad 702 to detect conductive objects, such as a user's finger, near to or touching an embossed key in the embossed keypad 702. The embossed keypad 702 may be constructed from a flexible sheet or film of polyethylene terephthalate (PET) or other suitable material. The embossed indicia, e.g. embossed keys, may comprise, for example, an over-molded plastic filling in the embossed regions of the embossed keypad 702 to provide stiffness and resistance.

Figure 8:
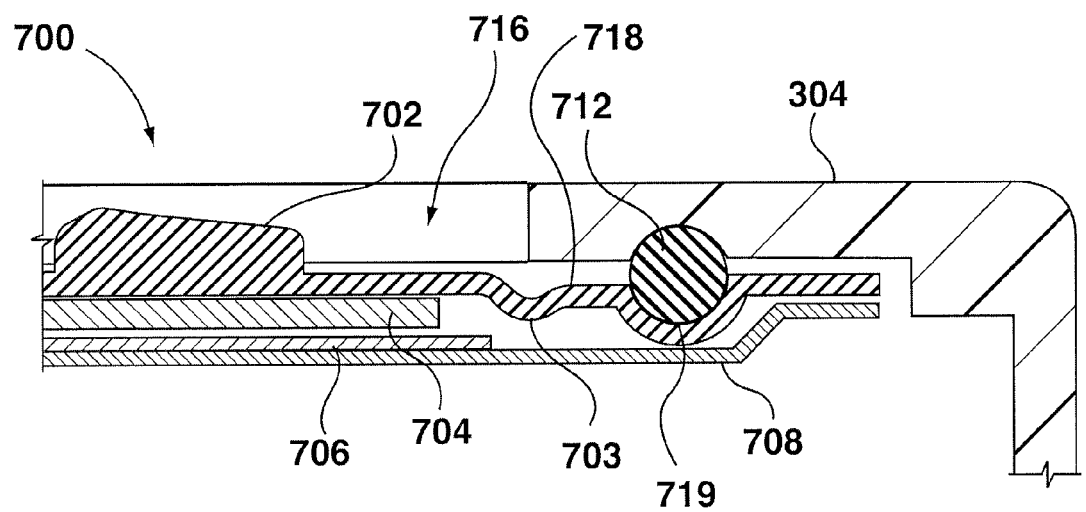
FIG. 8 is a sectional view of a portion of the keypad assembly of FIG. 6.
Figure 9:
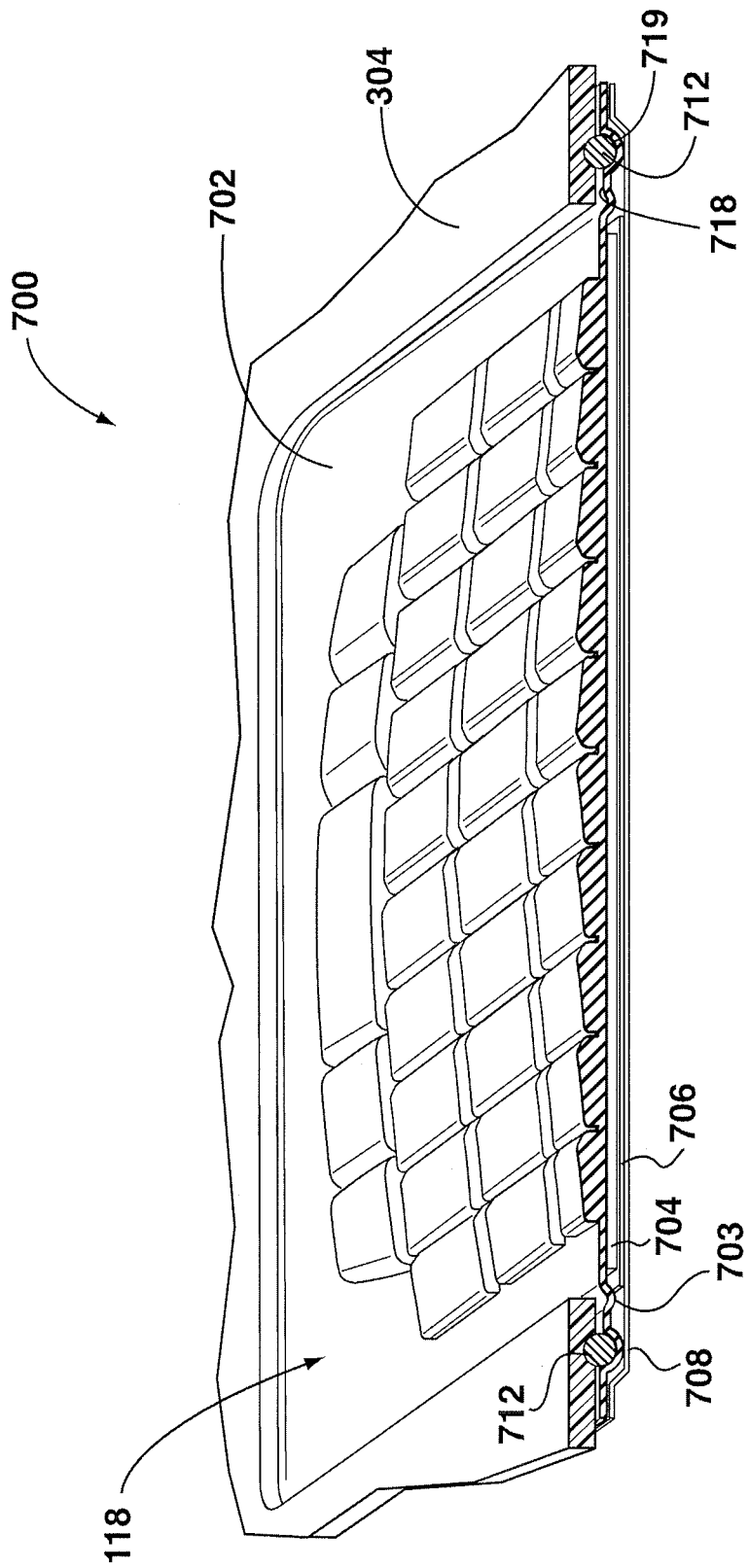
FIG. 9 is a sectional view of the full keypad assembly of FIG. 6.

As best shown in FIG. 8, in the shown example the dimensions of the capacitive sensor layer 704 are sized to fit the dimensions of the keypad window 716. The embossed keypad 702 includes an extended portion 718 which extends beyond the periphery of the keypad area, the dimensions of the capacitive sensor layer 704 and the keypad window 716. The extended portion 718 of the embossed keypad 702 is pinched around the edge of the keypad window 716 of the housing 200 so that the keypad assembly 700 may move, as described further below. In the shown example, the gasket 712 pinches the embossed keypad 702 around the edge of the keypad window 716. The gasket 712 is located inwards from the edge of the keypad window 716 at a distance sufficient to form a suitable seal with the housing 200. The inner surface of the internal cavity of the housing 200, and optionally the embossed keypad 702, may define a channel or groove 719 in which the gasket 712 is received. The embossed keypad 702 may further comprise a flexible bend or hinge portion 703 in the extended portion 718 which provides additional flexibility to the keypad 118. The flexibility assists in allowing the keypad assembly 700 to move relative to the housing 200 in response to applied forces such as a user's finger pressing on one of the embossed keys of the embossed keypad 702.

As described above, the embossed keypad 702 may optionally be formed from a transparent material such a transparent flexible sheet or film, such as PET, to provide backlighting for the embossed keys of the embossed keypad 702. In such cases, the capacitive sensor layer 704 comprises a transparent material in the form of transparent capacitive sensors, which may be formed by patterned indium-tin oxide (ITO). Backlighting may be provided by a light guide assembly shown in FIG. 12 located below the capacitive sensor layer 704, or possibly between the embossed keypad 702 and the capacitive sensor layer 704. The construction of light guide assemblies is known in the art and will only be described briefly herein.

As shown in FIG. 12, the light guide assembly comprises a light source, such as a number of spaced apart light emitting diodes (LEDs) 1202 (only one of which is shown), and a light guide 1204 configured to receive light emitted by the LEDs and transmit/direct at least a portion of the received light through the embossed keypad 702 and out of the embossed keys. Typically one LED 1202 illuminates a number of adjacent keys in embossed keypad 702; however, one LED 1202 may be provided for each key in embossed keypad 702 in some embodiments.

The light guide 1204 comprises one or more light diffusers 1206 which each receive light rays emitted by a respective LED 1202 at a light incident surface 1208 thereof. The light rays received by a light diffuser 1206 are diffused within it, and a portion of those light rays interact with light diversion features within the light guide. The light diversion features may comprise angular surfaces or other features which are positioned at an angle relative to the light incident surface. Alternatively, light diversion may be provided by the shape and/or properties of the material of the light diffuser 1206 such as its refractive index. The light diversion features reflect and redirect the light rays towards light emitting surfaces of the light diffuser 1206. Light rays emitted from the light emitting surfaces of the light diffuser 1206 are received by the embossed keys of the embossed keypad 702. The embossed keys transmit at least a portion of the received light therethrough and out of a top surface of the embossed keys exposed by the embossed keypad 702 for interaction.

The embossed keys of the embossed keypad 702 may be painted with a masking colour, which may match the colour of the housing 200, and laser-etched to remove a portion of the paint. The laser-etching may be used to form letters, numbers, symbols or other indicia associated with respective embossed keys in the paint. When the LEDs are activated during operation of the portable electronic device 100, the laser-etched portions are illuminated to provide a backlight in the shape of the corresponding letters, numbers, symbols or other indicia laser-etched into the paint. A backlight colour may be painted prior to the masking colour to vary the colour of the backlight for at least some of the embossed keys, in which case laser-etching removes the masking colour while leaving the backlight colour.

The capacitive sensor layer 704 comprises a capacitive sheet or film including a number of capacitive plate electrodes (not shown) configured to detect the presence of an object, such as a user's finger, near to or touching an embossed key in the embossed keypad 702. The capacitive sheet or film may be formed by depositing small capacitive plate electrodes on a suitable substrate. The capacitive sensor layer 704 also includes control circuitry which detects a change in the capacitance of a particular capacitive plate electrode. The control circuitry of the capacitive sensor layer 704 includes an interface 705, such as a flexible PCB, which connects the capacitive sensor layer 704 to the main PCB (not shown) of the portable electronic device 100.

The capacitive plate electrodes may be transparent electrodes formed, for example, using patterned ITO or other suitable material on a transparent substrate, to form a generally transparent capacitive sensor layer 704. The transparent capacitive sensor layer 704 facilitates the provision of backlighting for the embossed keypad 702 using a light guide assembly (not shown) located below the capacitive sensor layer 704.

Each capacitive plate electrode includes a capacitive plate pair. The capacitive plate pairs may be formed by capacitive plate electrodes deposited on opposite sides of the substrate. Each capacitive plate pair in the capacitive sensor layer 704 may be mapped to a particular embossed key in the embossed keypad 702. One or more capacitive plate pairs may be mapped to a particular embossed key in the embossed keypad 702. The capacitive plate pair(s) in the area located directly across from an embossed key in the embossed keypad 702 are typically mapped to that embossed key, and used by the processor 102 of the portable electronic device 100 when interpreting input events. Mapping information describing the relationship between the capacitive plate pairs and the embossed keys may be stored in persistent memory, such as the memory 110, for use by the processor 102 during operation.

Spaces may be provided between capacitive plate pairs in the capacitive sensor layer 704. The spaces between capacitive plate pairs correspond to spaces between embossed keys in the embossed keypad 702. The spacing between capacitive plate pairs may reduce or prevent co-detection, or erroneous detection, of the presence of an object by the capacitive plate pairs next to the intended target.

The particular capacitive plate pair which experiences a change in capacitance exceeding a threshold capacitance change, or which experiences a capacitance level exceeding a threshold capacitance level, is used to determine the location of an object near to or touching the embossed keypad 702. The processor 102 uses the determined location and the mapping of the capacitive plate pairs to the embossed keys to determine which embossed key corresponds to the detected location. The processor 102 then generates an output in accordance with the determined key which corresponds to the determined location. The output may be displaying a character, such as a letter, number or symbol associated with the determined key on the display screen 112, or executing a function or command associated with the determined key.

The actuator(s) 120 of keypad assembly 700 are moveable between a first position in an unactuated state to a second position in an actuated state. The actuator(s) 120 provides tactile feedback, preserving both the feel of a conventional keyboard or keypad. In other embodiments, the actuator(s) 120 may be omitted. In the shown example, the actuator(s) 102 comprises a piezoelectric assembly 706 located below the capacitive sensor layer 704.

A stiffener 711 (FIGS. 7 and 10) is located between the capacitive sensor layer 704 of the keypad 118 and the piezoelectric assembly 706. The stiffener 711 assists in distributing forces of the piezoelectric assembly 706, relatively evenly across the keypad 118. The stiffener 711 is typically a metal plate but may be a rigid plate formed from another material, such as a rigid plastic. The dimensions of the stiffener 711 are sized to fit the dimensions of the keypad window 716 in the housing 200 of the portable electronic device 100. The stiffener 711 is typically adhered or bonded to the bottom of the capacitive sensor layer 704, but may be adhered or bonded to the bottom of the light guide assembly (not shown) in some embodiments when backlighting is provided. In other embodiments, a mechanical dome switch actuator may be used rather than the piezoelectric assembly 706.

Figure 10:
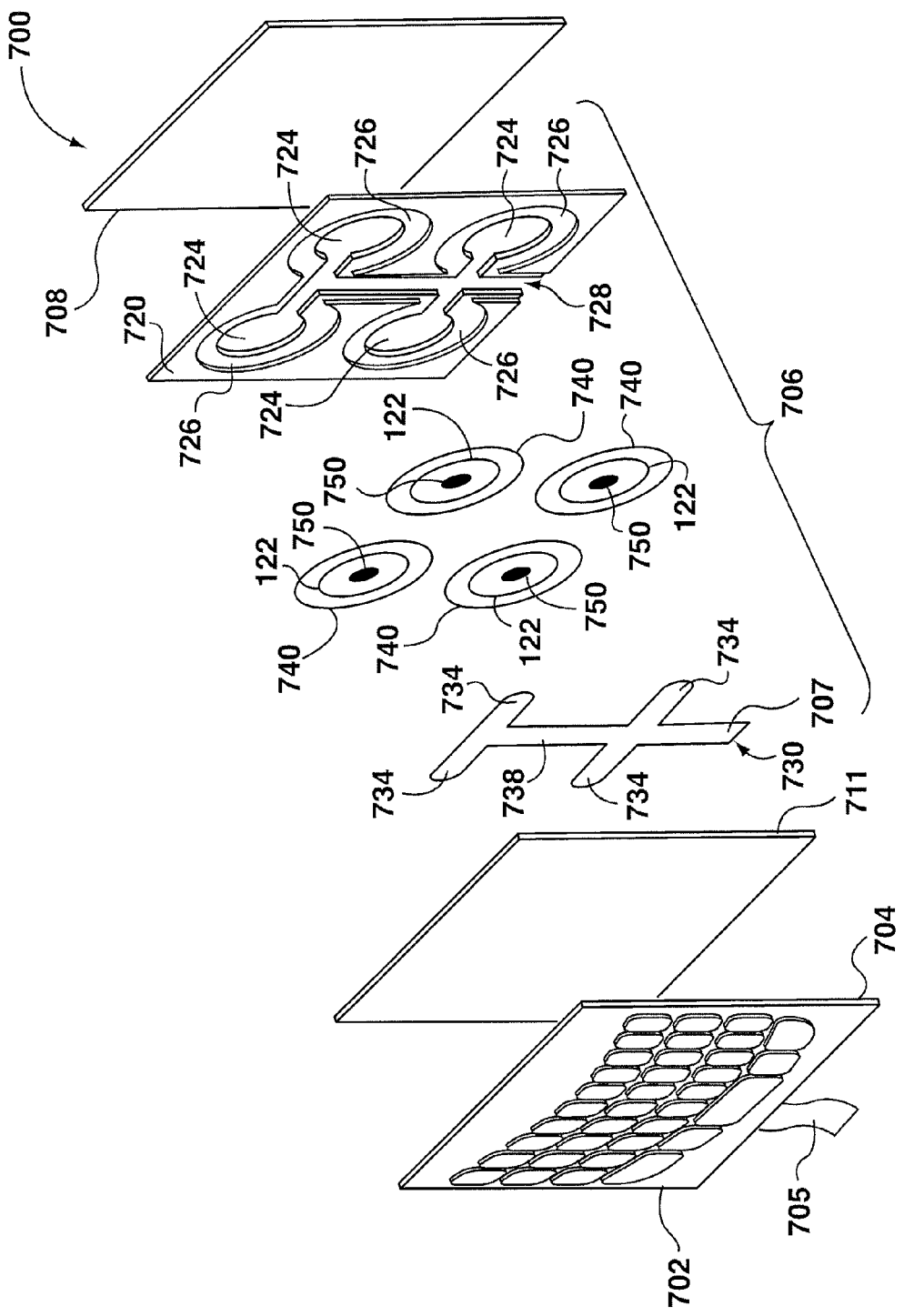
FIG. 10 is an alternate exploded view of the keypad assembly of FIG. 6 showing the actuator in greater detail.

As best shown in FIG. 10, in the shown example the piezoelectric assembly 706 comprises a frame 720, a flexible PCB 730, piezoelectric elements 740 connected to the flexible PCB 730 and supported by the frame 720, resilient biasing elements 750, force sensors 122 connected to the flexible PCB 730, and the support tray 708 which supports the piezoelectric assembly 706. The frame 720 and support tray 708 are generally the same size and shape as the keypad 118. In the shown example, the keypad 118, frame 720 and support tray 708 are generally rectangular. The frame 720 and support tray 708 may each be formed of metal, such as stainless steel, to provide the required strength while remaining relatively thin. Other suitable materials may be used in other embodiments.

The frame 720 defines a number of apertures 724 extending therethrough. A margin of the frame 720 around each of the apertures 724 provides a seat 726 for a piezoelectric element 740 such as a PZT ceramic disc. An insulating layer may be located or formed over the top of the frame 720 to electrically insulate the piezoelectric elements 740 from the frame 720. Alternatively, the frame 720 may be formed from an electrically insulating material. The seats 726 have a larger diameter than the piezoelectric device 740 and support the piezoelectric elements 740. The seats 726 of the frame 720 bend when the piezoelectric element 740 contracts diametrically as a result of a buildup of charge at the piezoelectric device 740. In other embodiments, the piezoelectric elements 740 may be an appropriately shaped piezoelectric fibre (sometimes known as a piezofibre) rather than a piezoelectric ceramic disc, such as a PZT ceramic disc. The frame 720 would be adapted to operate with the piezoelectric fibre in a similar manner to the piezoelectric ceramic discs described above.

In the shown example, four apertures 724 are defined in the frame 720, each having a seat 726 and being located near a respective corner of the frame 720. The piezoelectric elements 740 are generally disc-shaped and the apertures 724 and seats 726 are generally circular so as to correspond to the shape of the piezoelectric devices 740. A different number of piezoelectric devices 740, a different shape of piezoelectric device 740, or both may be used in other embodiments. Moreover, the piezoelectric elements 740 may be located elsewhere.

Each piezoelectric element 740 has an unactuated state and an actuated state. In the absence of an electric field, the piezoelectric element 740 exhibits the unactuated state. For example, the piezoelectric element 740 may have an unflexed or unexpanded condition in the absence of the electric field (e.g., concaved downwards from the general plane formed by its peripheral edge such that it is concaved away from the keypad 118, causing a corresponding configuration of the piezoelectric assembly 706). In the presence of an electrical field, the piezoelectric element 740 exhibits an actuated state. For example, the piezoelectric element 740 may have a flexed or expanded condition in the presence of an electric field (e.g., straightened or aligned with the general plane formed by its peripheral edge, causing a corresponding configuration of the piezoelectric assembly 706). Thus, generation of an electric field may be used to displace the piezoelectric element 740 from a first position in the unactuated state to a second position in the actuated state, and vice versa.

The electric field may be generated by first and second electrodes (not shown) attached to opposite sides of the piezoelectric device 740. The first and second electrodes may be bonded directly to the piezoelectric device 740, for example by silk-screening thin (e.g., 1-5 microns thick) silver first and second electrodes on opposing surfaces of the piezoelectric device 740. The first electrode is electrically connected to a power source, such as a current or voltage source, and the second electrode is electrically connected to a reference source, such as a ground source, or vice versa. When electrical power, such as an electrical signal, is applied to the first electrode, an electric field is generated between the first and second electrodes. The first and second electrodes are directly connected to the flexible PCB 730 of the piezoelectric assembly 706, and indirectly connect the piezoelectric elements 740 to the flexible PCB 730.

The frame 720 also defines a slot 728 for receiving the flexible PCB 730. The flexible PCB 730 includes an interface 707 which electrically connects the flexible PCB 730 to the main PCB of the portable electronic device 100. The flexible PCB 730 includes conductive traces that are electrically connected to the piezoelectric element 740 and force sensors 122, and indirectly to the main PCB of the portable electronic device 100. Conductive tape, or a conductive adhesive, may be used to attach each piezoelectric element 740 to the flexible PCB 730. The flexible PCB 730 in the shown example includes a central spine 738 received in the slot 728 in the frame 720 and two pairs of opposed arms 734 extending from the central spine 738. Each of the arms 734 is electrically connected to a force sensor 122 and a piezoelectric device 740.

In the shown example, a number of resilient biasing elements 750 are located between the piezoelectric elements 740 and the stiffener 711. A force sensor 122 is located between each biasing element 750 and the respective piezoelectric devices 740. The biasing elements 750 may be, for example, gel pads, silicone rubber or spring mechanisms. The resilient biasing elements 750 may be cylindrical or "puck-shaped". Additional biasing elements 750 may be located elsewhere, with or without a corresponding force sensor 122.

The force sensors 122, in at least some embodiments, are puck-shaped force sensing resistors for measuring applied forces (or pressure). The force sensing resistors detect forces as a decrease in resistance (or an increase in conductance) caused by the applied forces. The force sensors 122 may be utilized to determine a value related to an externally applied force on the keypad 118 because the force applied to the keypad 118 is translated to the force sensors 122. The piezoelectric elements 740 may be controlled to provide movement of the keypad 118 in response to detection of an applied force, on the keypad 118 that meets or exceeds a threshold level.

In the shown example, the force sensors 122 are located between the piezoelectric elements 740 and the stiffener 711 separating the keypad 118 and the piezoelectric assembly 706. In other embodiments, the force sensors 122 may be located elsewhere. The number of force sensors may also vary between embodiments. The force sensors 122, while shown located between a piezoelectric element 740 and biasing element 750, may be provided separate from any biasing element 750 in some embodiments, depending on the type of force sensor 122 used. Similarly, additional biasing elements 750 may be provided separate from the force sensors 122.

As shown in FIG. 8, the support tray 708, in the shown embodiment, is a generally rectangular sheet with two side rails (or side walls) on opposite sides of the sheet. The support tray 708 is typically a metal plate but may be a rigid plate formed from another material, such as a rigid plastic. The side rails of the support tray 708 may be connected to the stiffener 711, for example, by spot welding the side rails to the stiffener 711. Alternatively, the support tray 708 may form a mechanical interlock with the stiffener 711.

In other embodiments, rather than the frame 720, each piezoelectric element 740 may be supported by a support ring (not shown) that extends from the base 308 and supports the piezoelectric element 740 while permitting the piezoelectric element 740 to flex. The piezoelectric element 740 may be a PZT ceramic disc which is adhered to a substrate of larger diameter than the PZT ceramic disc for bending when the PZT ceramic disc contracts as a result of a build-up of charge. The support ring may be sized such that an edge of the substrate contacts the support ring supporting the PZT ceramic disc.

As briefly described above, the gasket 712 is located around a perimeter of the keypad area of the top surface of the embossed keypad 702, between the embossed keypad 702 and an inner surface of the internal cavity of the housing 200 of the portable electronic device 100. The gasket 712 provides a seal which seals the embossed keypad 702 to the front face 304 of the housing 200 and protects the components housed in the housing 200 of the portable electronic device 100. A suitable material for the gasket 712 includes, for example, an elastomeric material such as a rubber gasket or a cellular urethane foam for providing shock absorption, vibration damping and a suitable fatigue life.

As shown in FIG. 8 and as described above, the gasket 712 is used to pinch the flexible sheet of the embossed keypad 702 around the edge of the keypad window 716 in the housing 200 of the portable electronic device 100. The gasket 712 is located a small distance from the edge of the keypad window 716. The inner surface of the internal cavity of the housing 200, and optionally the flexible sheet, may define a channel or groove 719 in which the gasket 712 is received. The biasing elements 310 press against the keypad assembly 700, compressing the gasket 712 to provide a watertight seal around the keypad area of the keypad 118. In some embodiments, the keypad 118 of the portable electronic device 100 can withstand accidental immersion up to a depth of 1 meter of water for up to 30 minutes, thereby meeting the International Protection Rating IPx7 specification defined by the International Electrotechnical Commission (IEC) 60529 for electronic devices and possibly other similar specification or standards of different regulatory bodies.

The keypad assembly 700 is resiliently biased by the biasing elements 310 and moveable within the housing 200 in the direction normal to keypad 118 and the back 302 of the housing 200. The keypad assembly 700 is moveable between at least a first or unactuated position (rest position) away from the base 308 and a second or actuated position towards the base 308 in response to expansion and contraction of the piezoelectric elements 740 of the piezoelectric assembly 706, as described below. The keypad assembly 700 may also move slightly away from the base 308 before activation of the piezoelectric elements 740 in response to an externally applied force used to activate the piezoelectric elements 740. The movement of the keypad assembly 700 in response to externally applied forces is detected by the force sensors 122. When the keypad assembly 700 moves from the first position away from the base 308 to the second position towards the base 308, the resilient biasing elements 310 and 750 are compressed. Movement is permitted by the compression of the biasing elements 310 and 750, the flexing of the frame 720 in response to expansion and contraction of the piezoelectric devices 740, and flexing of the flexible bend or hinge portion 703 in the extended portion 718 of the flexible sheet of the embossed keypad 702.

In some embodiments, a mechanical preload may be applied to each piezoelectric element 740 in its unactuated state. The mechanical preload is a force applied to the piezoelectric elements 740 absent an externally applied force and absent a charge on the piezoelectric device 740. The mechanical preload causes slight bending of frame 720. An externally applied force on the keypad 118 which occurs before actuation of the piezoelectric devices 740, such as a user pressing an embossed key on the keypad 118, causes increased bending of the piezoelectric element 740 and the frame 720 applies a spring-like force against the keypad 118. When the piezoelectric element 740 is charged, the piezoelectric element 740 shrinks and causes the frame 720 and piezoelectric element 740 to apply a further force, opposing the externally applied force, on the keypad 118 as the piezoelectric element 740 straightens.

Each piezoelectric element 740 is located between the base 308 and the stiffener 711 such that an external applied force to the keypad 118, for example from a user pressing the keypad 118, can be measured by the force sensors 122, and such that charging the piezoelectric element 740 causes flexing or bending of the frame 720, causing the keypad assembly 700 to move from the unactuated position towards the base 308 of the housing 200 to the actuated position away from the base 308. When an applied force measured by the force sensors 122 exceeds a threshold level, the processor 102 causes an electric field to be generated in the presence of the piezoelectric elements 740 causing it to change from the unactuated state to the actuated state, thereby moving the keypad assembly 700 from the first position when in the unactuated state to the second position when in the actuated state. The removal of the charge causes the piezoelectric elements 740 to return to the first position in the unactuated state.

Figure 11:
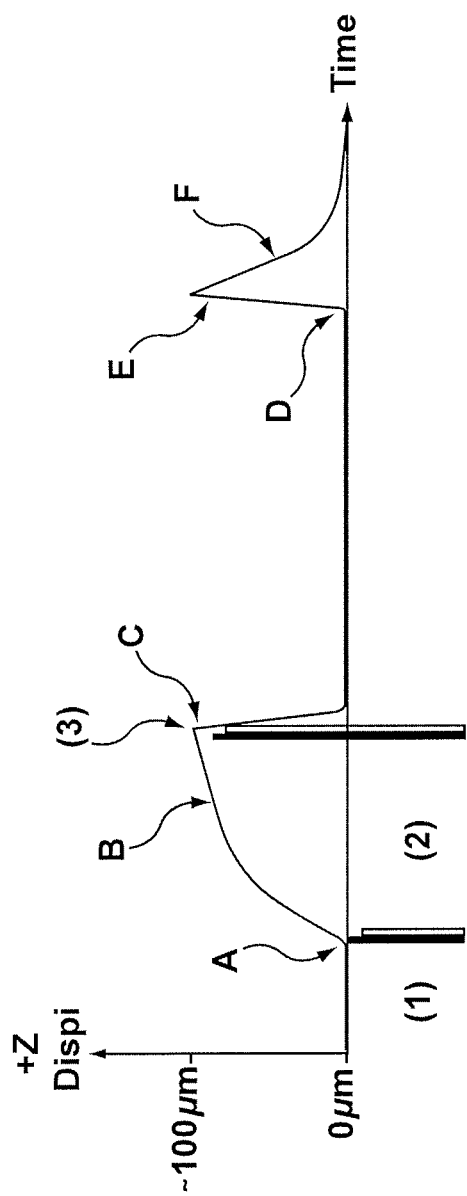
FIG. 11 is a chart illustrating displacement of an example embodiment of a keypad assembly in operation.

Reference is now made to FIG. 11, which is a chart illustrating the displacement of an example embodiment of the keypad assembly 700 in operation. At (1), when the piezoelectric assembly 706 does not receive a signal, there may be no electric field generated between the first and second electrodes, and the piezoelectric elements 740 are in its unactuated state. The piezoelectric elements 740 may be concaved downwards from the general plane formed by its peripheral edge such that it is concaved away from the keypad 118, causing a corresponding configuration of the piezoelectric assembly 706.

At (A), in response to an initial force applied to the keypad 118 by a device user and detected by the force sensors 122, the piezoelectric assembly 706 receives a signal, for example from the processor 102, causing the generation of an electric field between the first and second electrodes and a subsequent change of the piezoelectric elements 740 to the actuated state, which in this example brings the piezoelectric elements 406 (and by extension the piezoelectric assembly 706) to be substantially planar with its peripheral edge. This change to the actuated state typically occurs gradually enough to be unnoticeable by a user, as shown by the gradual rise (B). In this example, the piezoelectric assembly 706 exhibits a displacement of about 100 microns over about 20 ms from the unactuated to the actuated state.

Over the time period (2), the force applied to the keypad 118 by the user and detected by the force sensors 122 increases until a predetermined threshold is reached at (3) and the force is determined to be a full press. When the full press is determined, the signal to the piezoelectric assembly 706 is stopped, causing the dissipation of the generated electric field between the first and second electrodes and a subsequent change of the piezoelectric elements 740 back to the unactuated state (and by extension the piezoelectric assembly 706), which in this example is concaved away from the keypad 118. The change back to the unactuated state typically is relatively rapid so that the user feels the change, as shown by the sharp drop (C). In this example, the piezoelectric assembly 706 exhibits a displacement of about 100 microns over about 3 ms from the actuated to the unactuated state.

For the duration that the full press is maintained on the keypad 118, the piezoelectric assembly 706 remains unactuated. At (D) the force is removed, and this is sensed by the force sensors 122. When the removal of the force is determined, a signal is sent to the piezoelectric assembly 706, again generating the electric field between the first and second electrodes and a subsequent change of the piezoelectric elements 740 to the actuated state (and by extension the piezoelectric assembly 706. Typically, this occurs relatively rapidly such that the change is felt by the user, as shown by the sharp rise (D). In this example, the piezoelectric assembly 706 exhibits a displacement of about 100 microns over about 3 ms from the unactuated to the actuated state.

At (E), the signal to the piezoelectric assembly 706 is stopped, causing the generated electric field between the first and second electrodes to dissipate and thus the return of the piezoelectric elements 740 to the unactuated state (and by extension the piezoelectric assembly 706). The piezoelectric assembly 706 typically exhibits a gradual return to the unactuated state, as shown by the gradual drop (F). In this example, the piezoelectric assembly 706 gradually returns to its unactuated state over about 15 ms.

Thus, a user pressing on the keypad 118 may initially feel a resistance in response to a key press, as the piezoelectric assembly 706 changes to its substantially planar actuated state. As the user presses further down, the user may feel a give or clicking sensation, as the piezoelectric assembly 706 returns to its concave unactuated state. When the touch input is released, the user may feel an upwards clicking sensation, as the piezoelectric assembly 706 changes to its actuated state again, before finally relaxing back to its unactuated state. This behavior may be useful to provide tactile feedback for the keypad 118.

Figure 5:
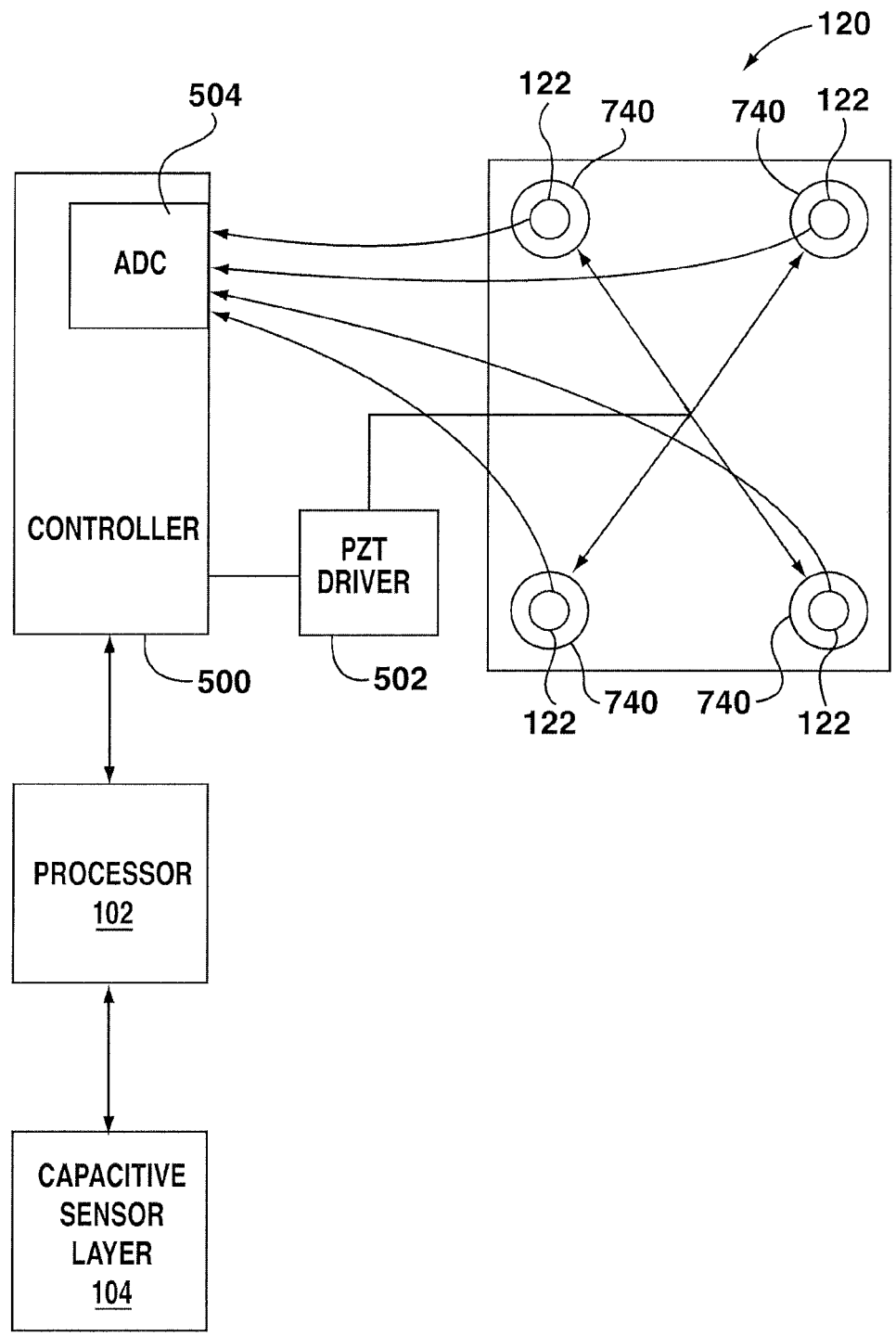
FIG. 5 is a block diagram of a circuit for controlling the actuators of the portable electronic device in accordance with an example embodiment of the present disclosure.
Figure 6:
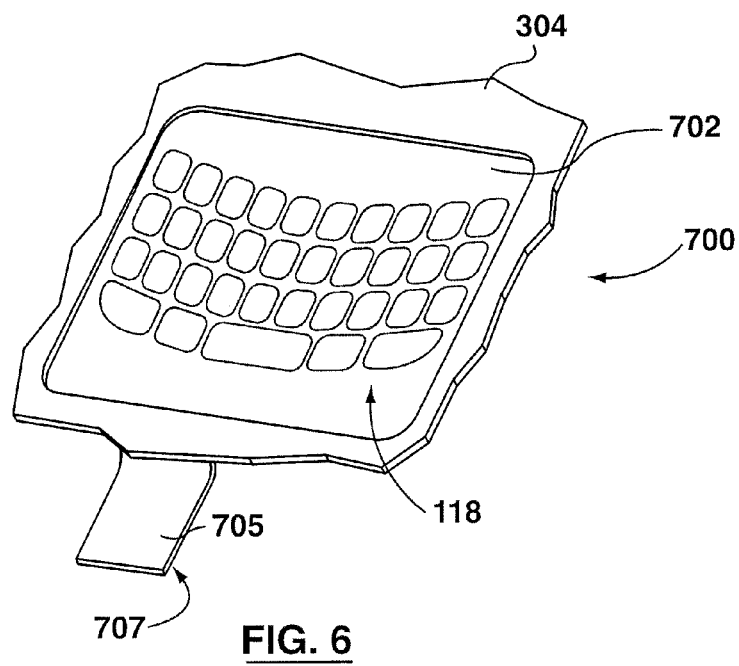
FIG. 6 is a perspective view of a keypad assembly for the portable electronic device in accordance with an example embodiment of the present disclosure.
Figure 7:
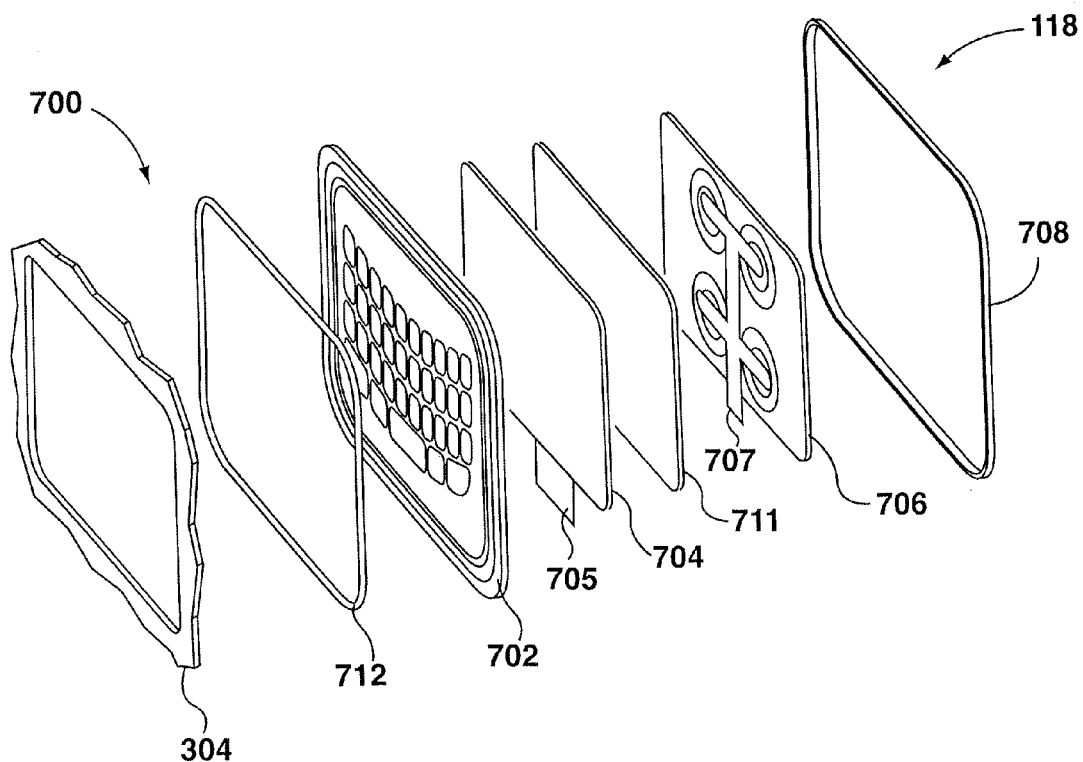
FIG. 7 is an exploded view of the keypad assembly of FIG. 6 in accordance with an example embodiment of the present disclosure.

FIG. 5 shows a circuit for controlling the piezoelectric elements 740 of the portable electronic device 100 in accordance with one embodiment of the present disclosure. The piezoelectric elements 740 are connected to a controller 500 such as a microprocessor including a piezoelectric driver 502 and an amplifier and analog-to-digital converter (ADC) 504 that is connected to each of the force sensors 122 and to each of the piezoelectric devices 740. In some embodiments, the ADC 504 may be a 9-channel ADC. The controller 500 is also in communication with the processor 102 of the portable electronic device 100. It will be appreciated that the piezoelectric driver 502 may be embodied in drive circuitry between the controller 500 and the piezoelectric devices 740.

The mechanical work performed by the piezoelectric elements 740 may be controlled to provide generally consistent force and movement of the keypad 118 in response to detection of an applied force on the keypad 118 in the form of a press or touch, for example. Fluctuations in mechanical work performed as a result of, for example, temperature, may be reduced by modulating the current to control the electric field and the charge/voltage of the piezoelectric devices 740.

The controller 500 controls the piezoelectric driver 502 for controlling the current to the piezoelectric devices 740, thereby controlling the charge/voltage of the piezoelectric devices 740. The charge may be increased to increase the force on the keypad 118, moving it away from the base 308. The charge may be decreased to decrease the force on the keypad 118, moving the keypad 118 toward the base 308. In the present example, each of the piezoelectric elements 740 are connected to the controller 500 through the piezoelectric driver 502 and are all controlled equally and concurrently. Alternatively, the piezoelectric elements 740 may be controlled separately.

The portable electronic device 100 is controlled generally by monitoring the keypad 118 for a "press" or "touch" thereon, and modulating a force on the keypad 118 for causing a first movement of the keypad 118 relative to the base 308 in response to detection of a "press" or "touch". The force sensors 122 may be used to detect a "press" caused, for example, by a user's finger applying an external force to the keypad 118. When an applied force measured by the force sensors 122 exceeds a threshold level, a press is detected. Alternatively, the capacitive sensor layer 704 may be used to detect a "touch" caused, for example, by a user's finger being near or touching an embossed key in the embossed keypad 702. In such embodiments, the amount of capacitance change caused by finger presence which is detected by the capacitive sensor layer 704 may be substituted for the amount of force detected by the force sensors 122 in the above-described embodiments.

In response to detection of a "press" or "touch" on the keypad 118, the charge/voltage of each of the piezoelectric elements 740 is modulated to modulate the force applied by the piezoelectric elements 740 on the keypad 118, and thereby cause movement of the keypad 118 which simulates the collapse of a dome-type switch, providing tactile feedback. When the end of the "press" or "touch" is detected, the charge/voltage at each of the piezoelectric elements 740 is modulated to modulate the force applied by the piezoelectric elements 740 on the keypad 118 to cause movement of the keypad 118 which simulates release of a dome-type switch, providing tactile feedback.

The ADC 504 is connected to the piezoelectric devices 740. In addition to controlling the charge at the piezoelectric devices 740, an output, such as a voltage output, from a charge created at each piezoelectric element 740 may be measured based on signals received at the ADC 504. Thus, when a pressure is applied to any one of the piezoelectric elements 740 causing mechanical deformation, a charge is created. A voltage signal, which is proportional to the charge, is measured to determine the extent of the mechanical deformation. Thus, the piezoelectric elements 740 also act as sensors for determining mechanical deformation. Accordingly, the piezoelectric elements 740 may act as force sensors for measuring externally applied forces and triggering the generation of an electric field which charges the piezoelectric elements 740 and causes the actuation of the piezoelectric elements 740 from the unactuated state. In other words, the piezoelectric elements 740 may act as a force sensor for triggering their own actuation. In such embodiments, the force sensors 122 may be omitted.

The keypad assembly described in the present disclosure may be used to reduce the thickness of the keypad of the portable electronic device compared to conventional keyboards and keypads based on physical actuation of a dome-switch or other moveable/mechanical switch. In some embodiments, the keypad assembly may only be a few millimeters (mm) in thickness, possibly 1-3 mm in thickness, and possibly close to 1 mm in thickness. The reduced thickness of the keypad may be used to reduce the overall thickness of the portable electronic device. The keypad assembly described in the present disclosure is also provided with a waterproof seal in the keypad area which may be used to provide a waterproof keypad in ruggedized devices. The waterproof keypad may, in at least some embodiments, meet the IPx7 specification for electronic device defined by the International Electrotechnical Commission (IEC) 60529 for electronic devices and other similar specification or standards of different regulatory bodies. The lack of a mechanical keypad or keyboard also improves performance for environmental and drop tests specific for ruggedized designs.

For inclusion in a waterproof electronic device, the buttons 130 may be constructed similar to the keypad 118 described above (e.g., each button 130 being a key in a small keypad) or the buttons 130 may be omitted. The buttons 130 may be part of the keypad 118, being exposed via a separate window in the housing 200 similar to the keypad window 716. In this way, the embossed keypad 702 may be used for the buttons 130, and the capacitive sensor layer 704 and piezoelectric assembly 706 may extend below the front face 304 for use in the buttons 130 in the same way as the keypad 118.

The navigation device 131 may be an optical joystick, as shown in FIGS. 2A and 2B, having a built-in flexible region in its optical lens to allow actuation/depression, or may use a flexible membrane-based mounting to provide a waterproof seal around the optical joystick. The optical joystick may have a piezoelectric assembly located below its optical lens which provides tactile feedback similar to the keypad 118 described above with the optical lens detecting the presence of an object, such as a user's finger, instead of the capacitive sensor layer 704. Alternatively, the piezoelectric assembly 706 of the keypad 118 may extend below the front face 304 of the housing 200 for use in the optical joystick in the same way as the keypad 118. Alternatively, the navigation device 131 may be omitted in some embodiments.

The keypad assembly described in the present disclosure may also be used to reduce the width of the keypad compared to conventional keyboards and keypads based on physical actuation of a dome-switch or other moveable/mechanical switch. Traditional high density keyboards and keypads used in portable electronic devices, such as full QWERTY and reduced QWERTY, are typically based on using dome-sheets which set the key density and also require slots between adjacent keys to avoid co-actuation of the keys situated next to the intended target. The distance between two adjacent keys is set by the dome diameter and the sealing requirements by the dome-sheet manufacturer. The minimum size of the capacitive embossed keys of the keypad assembly of the present disclosure is set by the minimum size of the capacitive plate electrodes in the capacitive sensor layer and the distance between adjacent capacitive plate electrodes. The capacitive sensor layer may be formed so that the distance between adjacent capacitive plate electrodes is smaller than the distance between two adjacent keys in a dome-sheet. In addition, actuator(s) may be located below the capacitive sensor layer and used to provide tactile feedback, thus preserving both the look and feel of a conventional keyboard or keypad.

The present disclosure may be embodied in other specific forms without departing from its spirit or essential characteristics. The described embodiments are to be considered in all respects as being only illustrative and not restrictive. The present disclosure intends to cover and embrace all suitable changes in technology. The scope of the present disclosure is, therefore, described by the appended claims rather than by the foregoing description. All changes that come within the meaning and range of equivalency of the claims are intended to be embraced within their scope.

The invention claimed is:

1. A portable electronic device, comprising:
a housing having a front face and defining an aperture in the front face, the aperture opening into an internal cavity defined by the housing;
a processor received within the housing;
a keypad assembly received in the aperture in the front face of the housing, the keypad assembly comprising:
an embossed keypad having a top and a bottom surface, the embossed keypad having a plurality of embossed keys on the top surface;
a capacitive sensor layer located below the bottom surface of the embossed keypad, wherein the capacitive sensor layer is connected to the processor, the capacitive sensor layer transmitting input signals to the processor when an object is detected near to or touching an embossed key in the plurality of embossed keys;
a piezoelectric assembly comprising at least one piezoelectric element, wherein the piezoelectric assembly is located below the capacitive sensor layer, wherein the keypad assembly is moveable between a first position relative to the housing when the piezoelectric assembly is in an unactuated state and a second position relative to the housing when the piezoelectric assembly is in an actuated state, whereby movement of the keypad assembly provides tactile feedback, wherein the movement from the first position to the second position is caused by modulation of the charge of the piezoelectric element; and
a gasket located around a perimeter of a keypad area of the embossed keypad and between the embossed keypad and an inner surface of the internal cavity of the housing, the gasket sealing the key assembly to the front face of the housing.

2. The portable electronic device of claim 1, wherein the embossed keypad comprises a flexible sheet, wherein the embossed keys are over-molded on the top surface of the flexible sheet.

3. The portable electronic device of claim 1, wherein the capacitive sensor layer comprises a capacitive sheet including a number of capacitive plate electrodes configured to detect the presence of an object near to or touching an embossed key in the plurality of embossed keys.

4. The portable electronic device of claim 3, wherein each capacitive plate electrode includes a capacitive plate pair deposited on opposite sides of a substrate.

5. The portable electronic device of claim 4, wherein spaces are provided between capacitive plate pairs in the capacitive sensor layer, the spaces corresponding to spaces between embossed keys in the embossed keypad.

6. The portable electronic device of claim 3, wherein the processor is configured to:
map capacitive plate pairs in the capacitive sensor layer to embossed keys of the embossed keypad, determine a location of a capacitive plate pair which experiences a change in capacitance exceeding a threshold capacitance change caused by the presence of an object near to or touching the embossed keypad in accordance with a mapping of the capacitive plate pairs to embossed key in the embossed keypad, determine a particular key in the embossed keys of the embossed keypad in accordance with the determined location, and generate an output in accordance with the determined key.

7. The portable electronic device of claim 1, further comprising:
a stiffener located between the capacitive sensor layer and the piezoelectric assembly.

8. The portable electronic device of claim 1, wherein the keypad assembly moves from the first position to the second position in response to expansion of the piezoelectric element caused by a decrease in a charge of the piezoelectric element, and the keypad assembly moves from the second position to the first position in response to contraction of the piezoelectric element caused by an increase in the charge of the piezoelectric element.

9. The portable electronic device of claim 1, wherein the first position is a rest position and the second position is an actuated position, wherein the piezoelectric assembly is resiliently biased against the capacitive sensor layer to permit movement of the keypad assembly the rest position and the actuated position relative to the housing.

10. The portable electronic device of claim 1, wherein the processor is configured to move the piezoelectric assembly between the first position to the second position in response to the detection of the presence of an object near to or touching an embossed key in the plurality of embossed keys.

11. The portable electronic device of claim 1, further comprising:
a force sensor located below the key assembly and connected to the processor, the force sensor configured to measure forces applied to the keypad assembly;
wherein the processor is configured to modulate the charge of the piezoelectric element to cause the keypad assembly to move between the first position to the second position in response to the detection of a force by the force sensor which exceeds a threshold level.

12. The portable electronic device of claim 1, wherein the embossed keypad and capacitive sensor layer are formed of a substantially transparent material, the keypad assembly further comprising a light guide assembly located immediately below the capacitive sensor layer for illuminating at least a portion of the embossed keys with light provided by a light source.

13. The portable electronic device of claim 12, wherein the light guide assembly comprises:
a light emitting diode (LED); and
a light diffuser positioned opposite the LED and having a light incident surface which receives light from the LED when activated, and at least one light emitting surface, wherein the light diffuser is configured to direct the received light towards at least one of the embossed keys to illuminate it.

14. The portable electronic device of claim 1, wherein the embossed keypad is formed from a transparent polyethylene terephthalate (PET) and the capacitive sensor layer is formed from patterned indium-tin oxide (ITO) or comprises an array of transparent capacitive sensors.

15. The portable electronic device of claim 1, wherein the inner surface of the internal cavity of the housing defines a channel in which the gasket is received.

16. The portable electronic device of claim 1, further comprising a display screen exposed by the housing and connected to the processor.

17. A method of controlling a keypad assembly of a portable electronic device, comprising:
determining a location of a capacitive plate pair which experiences a change in capacitance exceeding a threshold capacitance change caused by the presence of an object near to or touching an embossed keypad of the keypad assembly, the embossed keypad having a plurality of embossed keys on a top surface thereof;
determining a particular key in the embossed keys of the embossed keypad in accordance with the determined location;
modulating a charge of a piezoelectric element to cause the keypad assembly to move between a first position relative to a housing of the portable electronic device to a second position relative to the housing of the portable electronic device in response to the detection of the presence of an object near to or touching an embossed key in the plurality of embossed keys; and
generating an output in accordance with the determined key.

* * * * *